United States Patent [19]

Derick et al.

[11] 3,751,309

[45] Aug. 7, 1973

[54] THE USE OF A GLASS DOPANT FOR GAP AND ELECTROLUMINESCENT DIODES PRODUCED THEREBY

[75] Inventors: Lincoln Derick, Colonia; Andrew Stephen Jordan, Short Hills, both of N.J.; Hans Willem Verleur, Reading, Pa.

[73] Assignee: Bell Telephone Laboratories Incorporated, Murray Hill, N.J.

[22] Filed: Mar. 29, 1971

[21] Appl. No.: 128,998

[52] U.S. Cl. .................. 148/171, 148/172, 148/1.5, 148/1.6, 252/62.3 GA, 23/301 SP, 317/235 R, 29/571

[51] Int. Cl. ............................ H01l 7/38, H01l 7/40

[58] Field of Search .................... 148/172, 1.5, 171, 148/1.6, 190; 252/62.3 GA; 23/301 SP; 317/235 N; 29/571

[56] References Cited

UNITED STATES PATENTS

| | | | |
|---|---|---|---|
| 3,647,579 | 3/1972 | Ladany | 148/172 X |
| 3,549,401 | 12/1970 | Buszko et al. | 148/172 X |
| 3,632,431 | 1/1972 | Andre et al. | 148/171 X |
| 3,278,342 | 10/1966 | John et al. | 148/1.6 |
| 3,462,320 | 8/1969 | Lynch et al. | 148/171 |
| 3,470,038 | 9/1969 | Logan et al. | 148/172 X |

*Primary Examiner*—G. T. Ozaki
*Attorney*—W. L. Keefauver and Edwin B. Cave

[57] ABSTRACT

$Zn(PO_3)_2$, as a low melting point glass, is used as the zinc and oxygen doping source in the growth of the p-type region of gallium phosphide electroluminescent diode material. It is a relatively low vapor pressure liquid above 872°C permitting intimate contact with the GaP containing melt and rapid solution therein during crystal pulling or liquid phase epitaxial crystal growth.

10 Claims, 2 Drawing Figures

INVENTORS: L. DERICK
A. S. JORDAN
H. W. VERLEUR
BY George S. Indig
ATTORNEY

THE USE OF A GLASS DOPANT FOR GAP AND ELECTROLUMINESCENT DIODES PRODUCED THEREBY

BACKGROUND OF THE INVENTION

1. Field of the Invention

GaP electroluminescent devices.

2. Description of the Prior Art

Gallium phosphide electroluminescent diodes have recently been under intensive development for use in various visual displays. A number of techniques are currently under investigation for the growth of the gallium phosphide material to be employed. Small crystal platelets for experimental use have been produced by the "solution growth" technique (*Compound Semiconduction Vol. I*, Willardson and Goering, Rheinhold 1962, page 194). Bulk crystals have been grown by the Liquid Encapsulated Czochralski technique (*Journal of the Physics and Chemistry of Solids* 26, [1965] page 782). The bulk crystal produced can be then cut into crystal plates for use as substrates in further processing steps. The further processing steps usually involve the epitaxial deposition of additional gallium phosphide from a gallium solution onto the substrate (*Journal of the Electrochemical Society* 116, [1969] 933).

In a red emitting GaP electroluminescent diode the light is produced in a zinc and oxygen doped p-type region immediately adjacent to a p-n junction. When this junction diode is forward biased, electrons are injected from the n-type region into the p-type region and emit light in the neighborhood of Zn—O complexes. The efficiency of this process is known as electroluminescent efficiency. A related and correlated quantity which is often measured, is known as the photoluminescent efficiency. The measurement of this quantity involves the photoproduction of hole-electron pairs within Zn—O doped material and the observation of subsequently emitted red light.

The commonly used sources of the Zn—O dopant are metallic zinc and $Ga_2O_3$ powder (*Journal of Applied Physics* 36, [1965] 1528). A number of other compositions containing zinc and oxygen have been suggested by workers in the art, but have been rejected (see for example, *Philips Technical Review*, 26 [1965] page 136 ff). The use of zinc and gallium oxide however does present some practical problems. The temperature of GaP crystal growth is far above the melting point of zinc so that zinc has a high vapor pressure during growth resulting in the possibility of zinc loss. On the other hand gallium oxide is a solid at growth temperatures and must be used as a fine powder to facilitate solution in the melt. This powder presents a handling problem and a problem of adsorption of impurities from the atmosphere.

SUMMARY OF THE INVENTION

It has been found that zinc metaphosphate, $Zn(PO_3)_2$ is an excellent source for the zinc and oxygen doping required in the p-type region of a gallium phosphide electroluminescent diode. It is a member of the $ZnO—P_2O_5$ system, which has been investigated previously for the crystalline properties of some of its members (*Journal of the Electrochemical Society*, 105 [1958] page 125). An extensive testing program has shown zinc metaphosphate to be at least as good and in most cases a superior doping source in all of the commonly used growth methods in which GaP is solidified from a liquid nutrient. In each method tried its use yields comparable or improved luminescent efficiencies as compared with the use of the common $Zn—Ga_2O_3$ doping source. Since it is a liquid at the growth temperatures it can be handled as large chunks during the setup procedures as opposed to the fine gallium oxide powders required to facilitate the solution of the oxide in the melt. Also, since zinc metal is not present, it can not volatilize during the warm-up period.

DETAILED DESCRIPTION OF THE INVENTION

Diode Structures

Figure 1:
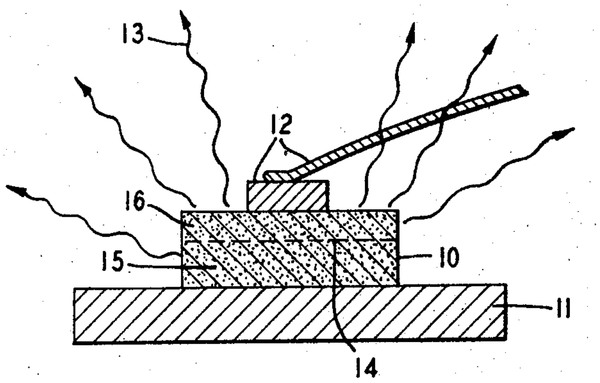
FIG. 1 is a plan view section of an exemplary gallium phosphide electroluminescent diode.

FIG. 1 shows an exemplary gallium phosphide electroluminescent diode. To the semiconducting body 10 are affixed two metallic contacts 11, 12 in order to provide the electrical current needed to produce light output 13. The dashed line 14 within the semiconducting body 10 separates regions of opposite conductivity type 15, 16. A number of different arrangements are under development for the internal structure of the semiconducting body 10. The lower region 15, which may be n- or p-type may be produced, for example, by "solution growth" or a bulk growth process. The upper region 16 may be produced, for example, by the epitaxial deposition of gallium phosphide of one conductivity type on the substrate 15 of the other conductivity type or by diffusion of dopants of one conductivity type into a semiconducting body 10 doped with dopant of the other conductivity type. In the epitaxial deposition or diffusion processes referred to above the lower region 15 may itself be the product of epitaxial deposition of gallium phosphide of one conductivity type upon a bulk grown substrate of the same conductivity type. This substrate is usually gallium phosphide but other semiconducting substrates have been used.

Crystal Growth

Figure 2:
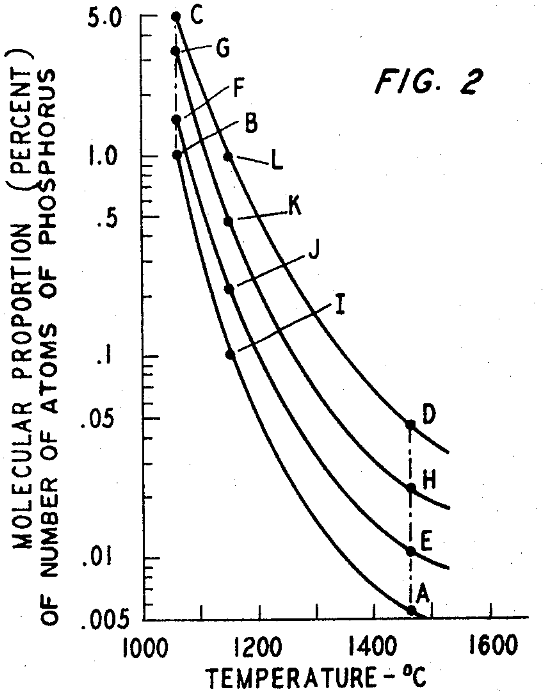
FIG. 2 is a graph showing the preferred dopant concentration ranges in terms of the molecular proportion of $Zn(PO_3)_2$ to the number of phosphorus atoms in the melt (ordinate) as a function of temperatures (abscissa).

The different crystal growth methods referred to above may employ melts of different compositions, thus take place at different temperatures. These temperatures are defined by the liquidus curve of the gallium phosphide system (*Journal of the Physics and Chemistry of Solids*, 26 [1965] page 789). The distribution coefficients of the zinc and oxygen dopants (i.e., the concentration of dopant in the solid as a fraction of the concentration of that dopant in the liquid) also varies with temperature. It follows that the recommended concentration of $Zn(PO_3)_2$ as a starting ingredient varies with temperature, thus with the growth process. Czochralski pulling of a bulk crystal from a stoichiometric melt takes place at about 1465°C. It has been found that the best luminescent efficiencies are produced when $Zn(PO_3)_2$ is included in the starting materials in a molecular proportion of between 0.005 to 0.05 percent of the number of phosphorous atoms in the melt. A more preferred concentration is from .01 to .025 percent of the number of phosphorous atoms in the melt. These concentrations are indicated in FIG. 2 as points A, E, H and D.

The "solution growth" process is usually performed with less than 10 atomic percent phosphorus in the melt at a temperature less than 1200°C. The distribution coefficients of the zinc and oxygen dopants are such as to require a higher concentration of $Zn(PO_3)_2$ in the melt at lower growth temperatures in order to produce optimum luminescent efficiencies. In the solution growth process described, the best luminescent efficiencies are realized when $Zn(PO_3)_2$ is included as a starting ingredient in a molecular proportion between 0.1 and 1 percent of the number of phosphorus atoms in the melt. The more preferred concentration range is between 0.2 and 0.5 percent of the number of phosphorus atoms in the melt. These concentrations are indicated in FIG. 2 as points I, J, K and L.

Epitaxial deposition of thin layers usually take place at still lower phosphorus concentrations. It is common practice to use a gallium solution containing of the order of 5 atomic percent phosphorus. Reference to the liquidus curve shows that, at this concentration, growth is initiated at of the order of 1060°C. In this temperature range optimum luminescent efficiencies are produced by the inclusion of $Zn(PO_3)_2$ in a molecular proportion of between 1 and 5 percent of the number of phosphorus atoms in the melt. The more preferred concentration range is between 1.5 and 3.5 percent of the number of phosphorus atoms in the melt. These concentrations are indicated in FIG. 2 as points B, F, G and C. The recommended $Zn(PO_3)_2$ concentration is of course more a function of temperature than of the particular growth process used. As indicated by curves CLD, GKH, FJE and BIA of FIG. 2.

Preparation of $Zn(PO_3)_2$ $Zn(PO_3)_2$ in a convenient glass form can be prepared by the following process, zinc oxide (ZnO) and ammonium monophosphate [$(NH_4)_2HPO_4$] of greater than 99 percent purity are reacted according to the following chemical equation;

$$ZnO + 2(NH_4)_2HPO_4 = Zn\ (PO_3)_2 + 4NH_3 + 3H_2O.$$

A representative batch consist of 26.4 grams of the ammonium monophosphate and 8.14 grams of zinc oxide. These are thoroughly mixed as powders and placed in a shallow platinum dish. The dish is placed in an oven and maintained at 500°C for ~½ hour, 600°C for ~½ hour and then 700°C for ~½ hour during which time the $H_2O$ and $NH_3$ are driven off. The temperature is then increased to 1,000°C and maintained for several (e.g. 4) hours. The dish is removed hot from the oven and the liquid glass is poured on to a clean plate to solidify. The resulting glass is broken into convenient size pieces and stored in a desiccator until used.

EXAMPLE 1

In an exemplary Liquid Encapsulation Czochralski growth process 15 milligrams of $Zn(PO_3)_2$ were added to 54 grams of gallium phosphide, a characteristic portion of the resulting crystal possessing a photoluminescent efficiency of 0.019 percent red light emission. A comparable crystal produced using equivalent amount of zinc and gallium oxide produced a photoluminescent efficiency of 0.015 percent.

EXAMPLE 2

In an exemplary solution growth process 37.7 milligrams of $Zn(PO_3)_2$ was added to 60 grams of gallium and 6 grams gallium phosphide. Characteristic crystal platelets thus produced possess a photoluminescent efficiency of 3.8 percent red light emission. These results are also comparable to the results of parallel experiments using zinc and gallium oxide dopants.

EXAMPLE 3

In an exemplary epitaxial deposition experiment a thin layer of zinc-oxygen doped gallium phosphide was grown on a substrate of n-type gallium phosphide grown by vapor deposition on a gallium arsenide plate. In order to perform the liquid deposition, 39 milligrams of $Zn(PO_3)_2$ was added to 8 grams of gallium and 0.8 grams of gallium phosphide. Typical resulting diodes possessed an electroluminescent efficiency of 1.5 percent. A parallel experiment using zinc and gallium oxide dopant resulted in a comparable efficiency. These results are experimental in nature and do not represent the highest attainable efficiencies, even though they do represent $Zn(PO_3)_2$ concentrations in the preferred ranges.

Although exemplified at a few discrete temperatures above the preferred concentration ranges are smooth functions of temperature. These ranges are set forth in FIG. 2 where the molecular proportion of $Zn(PO_3)_2$ (ordinate) as a percent of the number of phosphorous atoms in the melt is plotted against the starting temperatures of the growth process (abscissa). Curve ABCDA circumscribes the area of preferred concentrations and curve EFGHE circumscribes the area of more preferred concentrations. These areas can be approximated by the straight line segments connecting points AIBCLDA and EJFGKHE respectively. Since the efficiency is a slowly varying function of concentration, these straight line bounded areas adequately represent the areas of preferred and more preferred concentration. The $Zn(PO_3)_2$ can be introduced into the melt prior to or subsequent to melt down.

What is claimed is:

1. A method for the production of a crystalline portion of p-type gallium phosphide from a melt comprising gallium and phosphorus characterized in that $Zn(PO_3)_2$ is introduced into the melt as a zinc and oxygen doping source.

2. A method of claim 1 in which the $Zn(PO_3)_2$ is introduced into the melt after the melt has become molten.

3. A method of claim 1 in which the $Zn(PO_3)_2$ is introduced in a molecular proportion between .005 percent and 5 percent of the number of atoms of phosphorus in the melt and within the area of FIG. 2 circumscribed by curve ABCD.

4. A method of claim 3 in which the p-type region is grown as a portion of a bulk crystal by the deposition onto a seed crystal from the melt, which melt is essentially stoichiometric in its gallium phosphide content.

5. A method of claim 4 in which the $Zn(PO_3)_2$ is introduced in a molecular proportion between 0.005 percent and 0.05 percent of the number of atoms of phosphorus in the melt.

6. A method of claim 3 in which the p-n type region is grown as a crystal platelet by the slow cooling of a melt, which melt contains less than 10 atomic percent phosphorus.

7. A method of claim 6 in which the $Zn(PO_3)_2$ is introduced in a molecular proportion between 0.1 percent and 1 percent of the number of atoms of phosphorus in the melt.

8. A method of claim 3 in which the p-type region is deposited from the melt as a thin epitaxial layer on a crystalline gallium phosphide substrate, which melt contains less than 5 atomic percent phosphorus.

9. A method of claim 8 in which the $Zn(PO_3)_2$ is introduced in a molecular proportion between 1 percent and 5 percent of the number of atoms of phosphorus in the melt.

10. A method of claim 3 in which the $Zn(PO_3)_2$ is introduced in a molecular proportion within the area of FIG. 2 circumscribed by the curve EFGH.

* * * * *